United States Patent [19]

Yamamoto et al.

[11] Patent Number: 5,410,169
[45] Date of Patent: Apr. 25, 1995

[54] DYNAMIC RANDOM ACCESS MEMORY HAVING BIT LINES BURIED IN SEMICONDUCTOR SUBSTRATE

[75] Inventors: Tadashi Yamamoto, Kawasaki; Shizuo Sawada, Yokohama, both of Japan

[73] Assignee: Kabushiki Kaisha Toshiba, Kawasaki, Japan

[21] Appl. No.: 20,444

[22] Filed: Feb. 22, 1993

Related U.S. Application Data

[63] Continuation of Ser. No. 659,570, Feb. 22, 1991, abandoned.

[30] Foreign Application Priority Data

Feb. 26, 1990 [JP] Japan ................................ 2-42431

[51] Int. Cl.⁶ .................................... H01L 27/108
[52] U.S. Cl. .................................. 257/301; 257/306; 257/621; 257/305
[58] Field of Search .............. 357/23.6; 257/621, 305, 257/296, 301, 306

[56] References Cited

U.S. PATENT DOCUMENTS

| | | | |
|---|---|---|---|
| 4,811,067 | 3/1989 | Fitzgerald et al. | 257/301 |
| 4,912,535 | 3/1990 | Okumura | 257/301 |

FOREIGN PATENT DOCUMENTS

| | | |
|---|---|---|
| 63-263758 | 10/1988 | Japan . |
| 63-300550 | 12/1988 | Japan . |
| 1-011360 | 1/1989 | Japan . |
| 1-042167 | 2/1989 | Japan . |
| 1-067956 | 3/1989 | Japan . |
| 1-146353 | 6/1989 | Japan . |
| 1-160047 | 6/1989 | Japan . |

*Primary Examiner*—William D. Larkins
*Attorney, Agent, or Firm*—Banner, Birch, McKie & Beckett

[57] ABSTRACT

There is provided a DRAM memory cell structure. The semiconductor structure includes a semiconductor substrate of a first conductivity type having a main surface, source and drain regions of a second conductivity type formed in the main surface area of the semiconductor substrate, word lines extending in a first plane direction and formed on those portions of the semiconductor substrate which respectively lie between the source and drain regions, capacitors each having one of the source and drain regions as a storage node electrode, and bit lines buried in the semiconductor substrate and electrically connected to the source or drain regions, respectively.

15 Claims, 20 Drawing Sheets

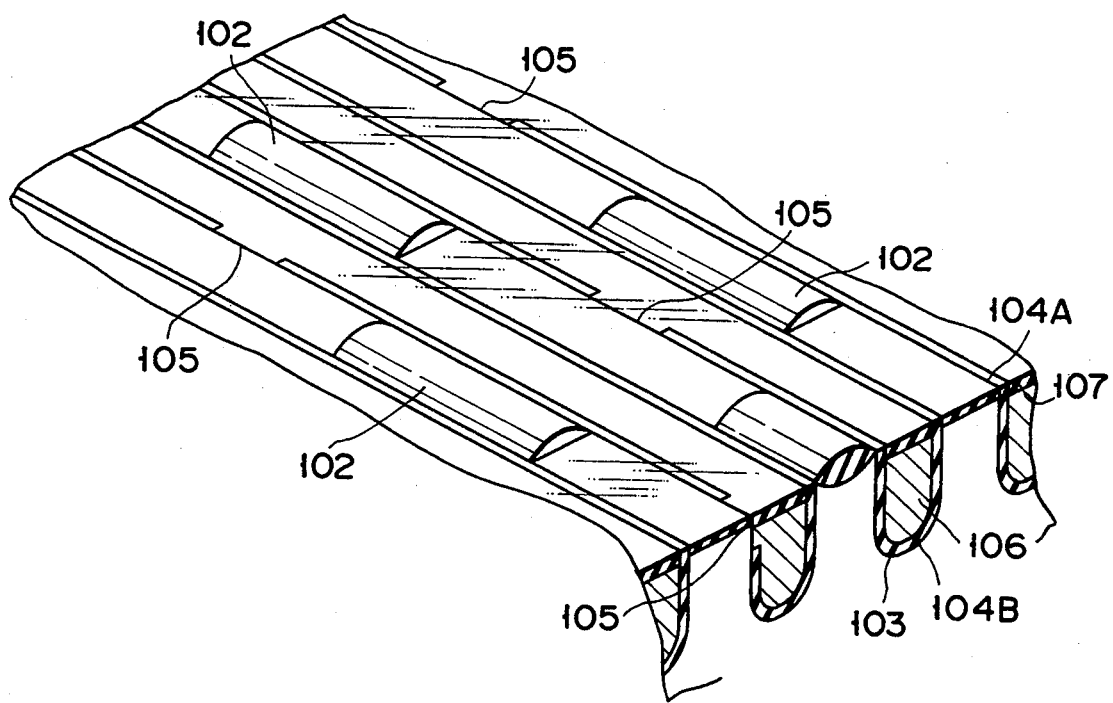
F I G. 7H

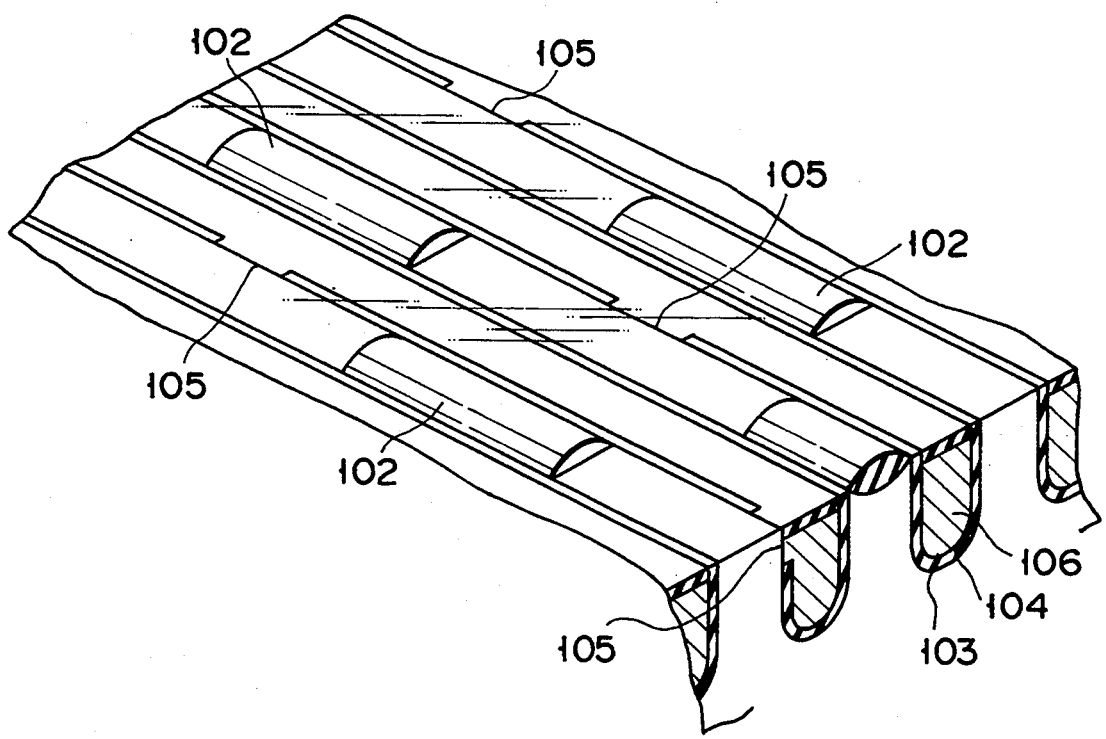
F I G. 71

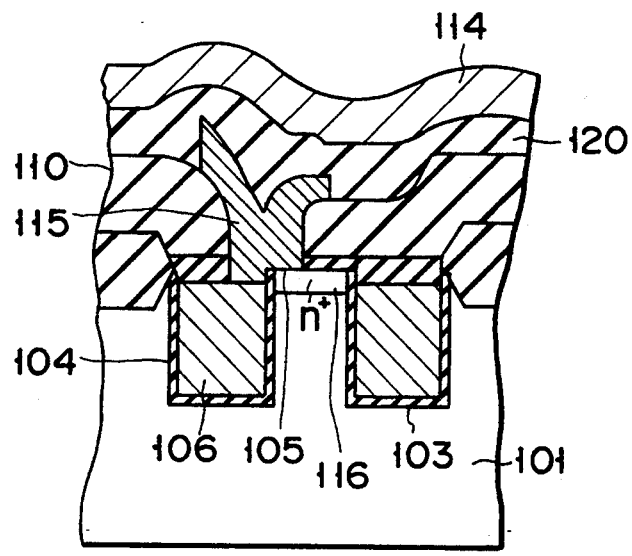
F I G. 8
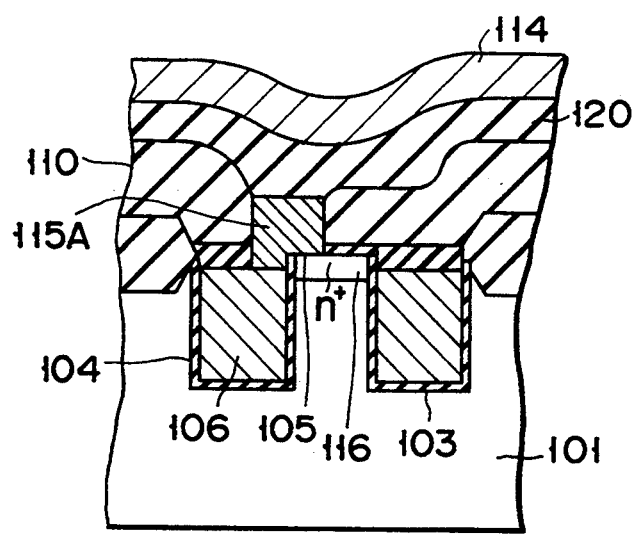
F I G. 9

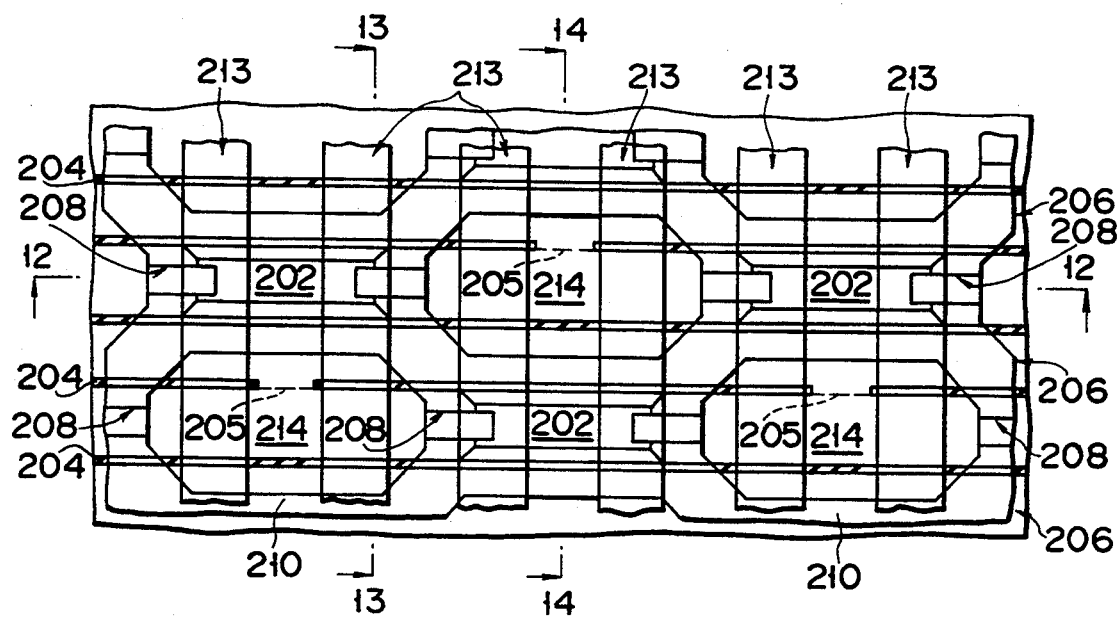
F I G. 10
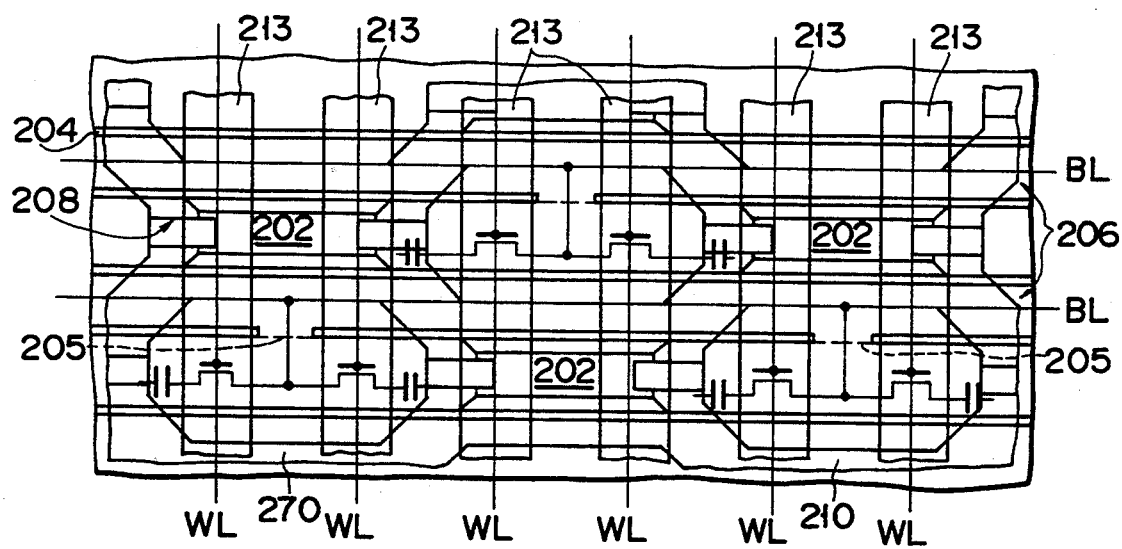
F I G. 11

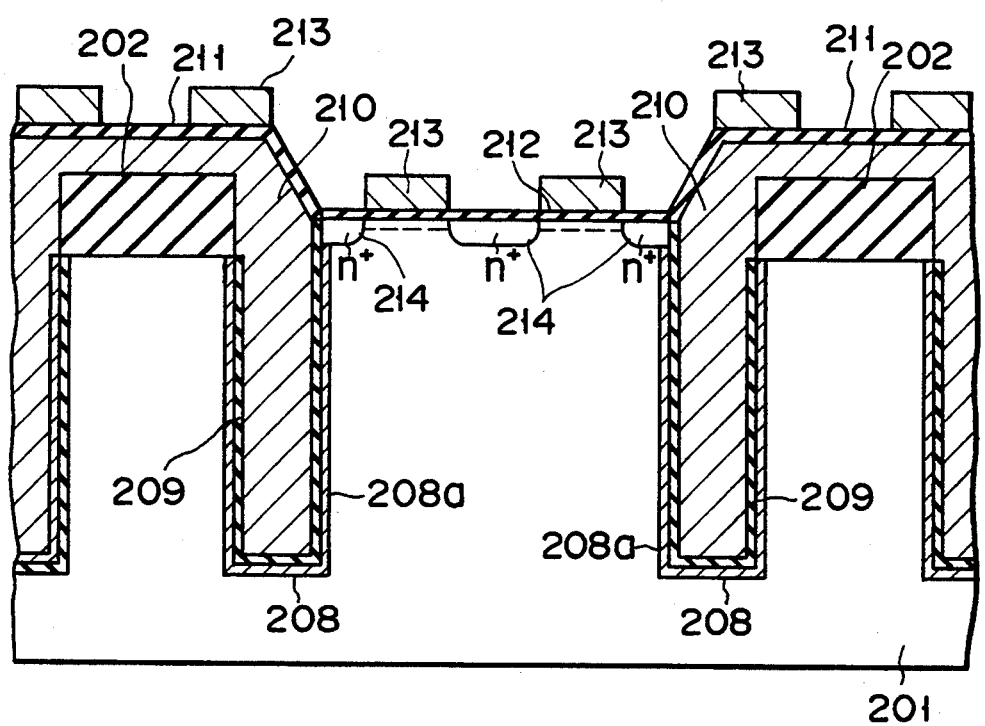
F I G. 12

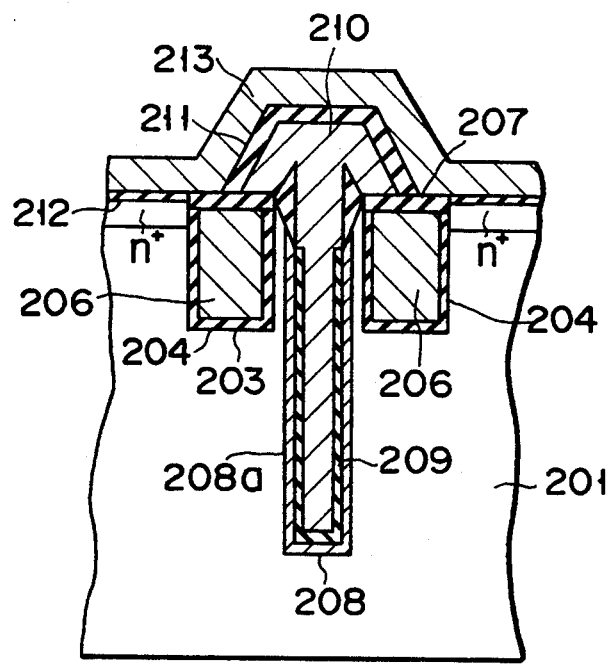
F I G. 13
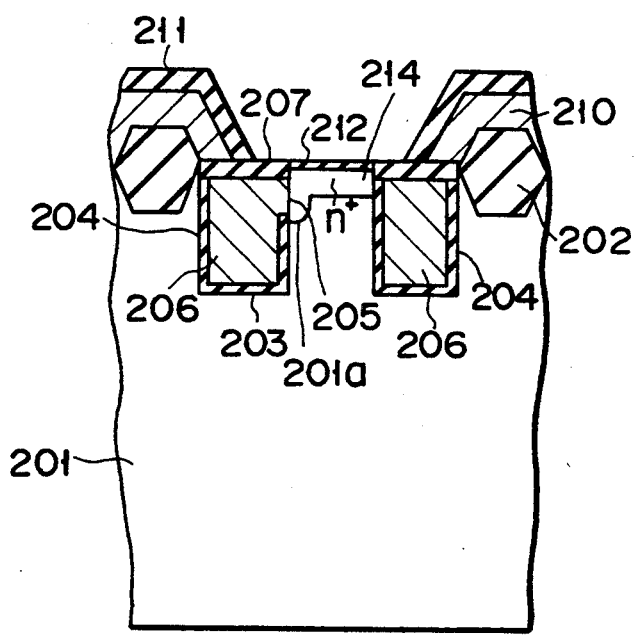
F I G. 14

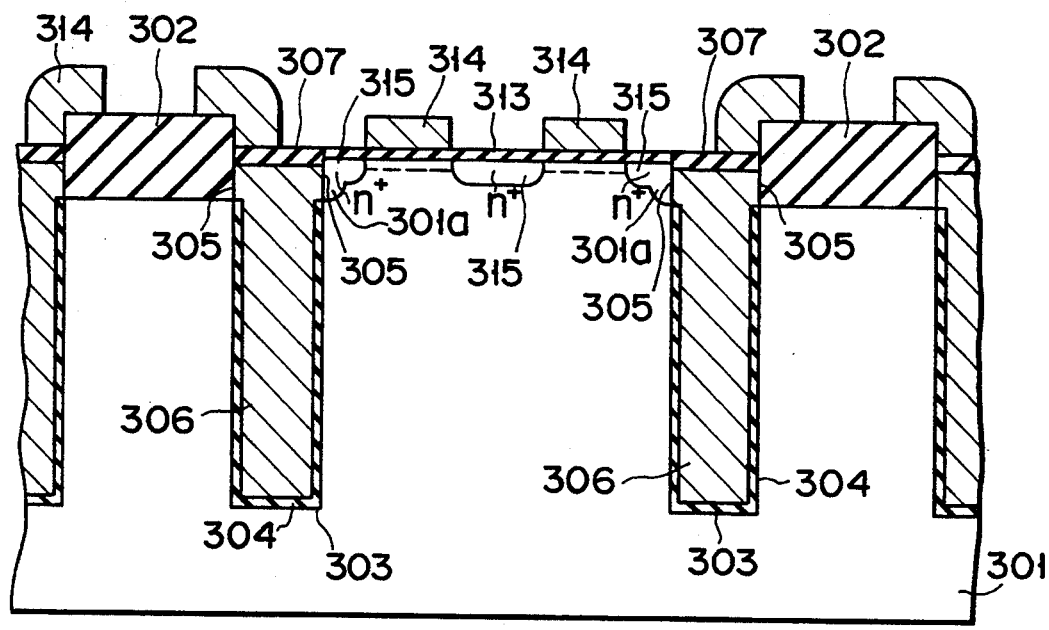
F I G. 17

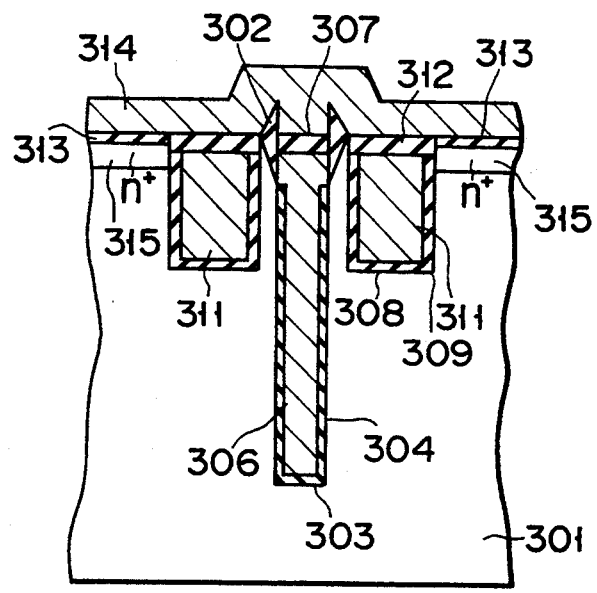
F I G. 18
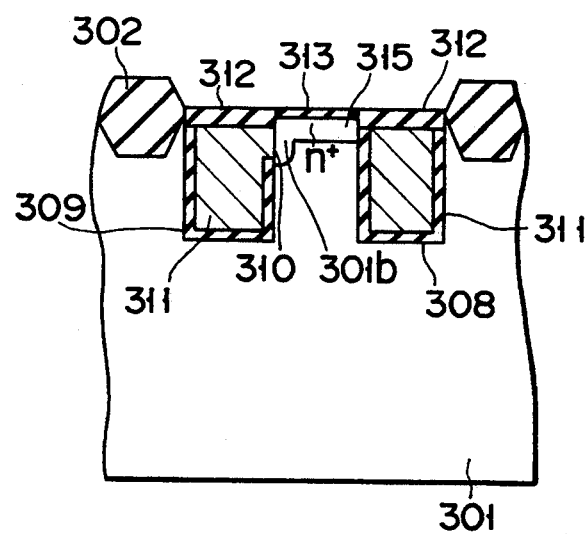
F I G. 19

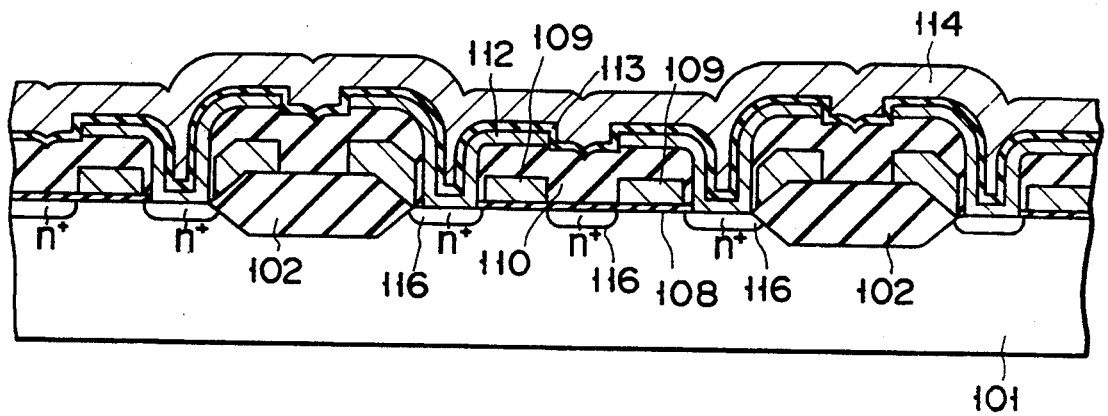
F I G. 23
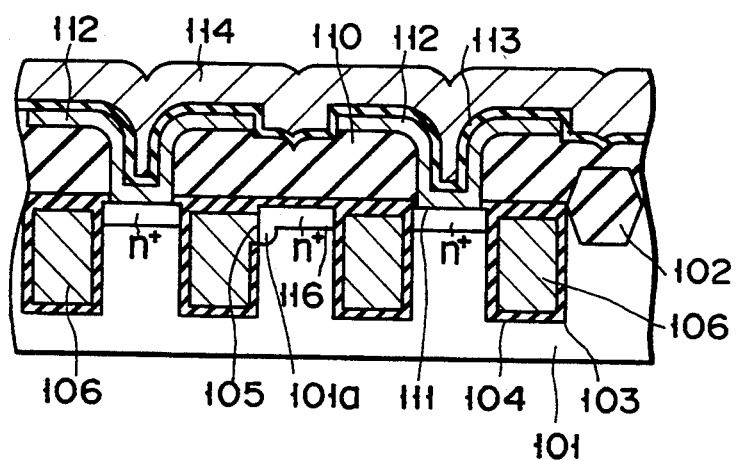
F I G. 24

DYNAMIC RANDOM ACCESS MEMORY HAVING BIT LINES BURIED IN SEMICONDUCTOR SUBSTRATE

This application is a continuation of application Ser. No. 07/659,570, filed Feb. 22, 1991, now abandoned.

BACKGROUND OF THE INVENTION

1. Field of the Invention

This invention relates to a dynamic random access memory (DRAM) and more particularly to the construction of memory cells thereof.

2. Description of the Related Art

The integration density and memory capacity of a DRAM in which each memory cell is formed of one transistor and one capacitor are rapidly increased with the progress of fine patterning technique. Use of a stacked capacitor cell structure is known as a method of increasing the capacitances of capacitors in the DRAM.

FIG. 1 is a cross sectional view of the conventional stacked capacitor cell taken along a bit line direction.

In order to form the stacked capacitor cell, a field oxide film 502 serving as an element isolation region is formed on a P-type silicon substrate 501 by local oxidation of silicon. After this, a gate oxide film 503, gate electrode 504 and source/drain diffused regions 505 are formed to constitute a transfer transistor. Further, an interlevel insulator 506 is disposed on the resultant structure and a storage node electrode 508 with a film thickness of 3000 Å, for example, is formed of phosphorus doped polysilicon in a contact hole 507 formed in the interlevel insulator 506. In order to electrically connect the storage node electrode 508 to the source/drain diffused regions 505, phosphorus is generally ion-implanted into the substrate 501 and storage node electrode 508 to approximately $1 \times 10^{16}$ cm$^{-2}$ (dose).

Then, a plate electrode 510 is formed of phosphorus doped polysilicon to a film thickness of 3000 Å, for example, with a capacitor dielectric film 509 disposed between the plate electrode 510 and the storage node electrode 508 and the like so as to form a stacked capacitor. After this, an interlevel insulator 511 is formed on the resultant structure and a contact hole 512 is continuously formed in the interlevel insulators 511 and 506. A bit line which is connected to the drain region 505 via the contact hole 512 is formed of a molybdenum silicide film 513, for example.

The DRAM stacked capacitor cell is formed through the above manufacturing process.

When the DRAM having the above stacked capacitor cell is formed with a high integration density, the following problems may occur.

That is, since the contact hole 512 is formed after the transfer transistor is formed and the stacked capacitor cell is formed, and then the bit line is connected to the drain region 505, it is necessary to form a deep contact hole, thus increasing the step in level of the bit line.

SUMMARY OF THE INVENTION

An object of this invention is to provide a semiconductor device having flat memory cells suitable for high integration.

The above object can be attained by a semiconductor memory device comprising a semiconductor substrate of a first conductivity type having a main surface; source and drain regions of a second conductivity type formed in the main surface area of the semiconductor substrate; word lines extending in a first plane direction and formed on those portions of the semiconductor substrate which respectively lie between the source and drain regions; capacitors each having one of the source and drain regions as a storage node electrode; and bit lines buried in the semiconductor substrate and electrically connected to the source or drain regions, respectively.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 7G to FIG. 7I are perspective views showing a method of manufacturing the DRAM memory cell according to a modification of a first embodiment;

FIG. 8 is a cross sectional view of the same portion as that of FIG. 5 and shows a DRAM memory cell according to a second embodiment of the present invention;

FIG. 9 is a cross sectional view of the same portion as that of FIG. 5 and shows a DRAM memory cell according to a modification of the second embodiment.

FIG. 10 is a pattern plan view of a memory cell area of a DRAM according to a third embodiment of the present invention;

FIG. 11 is a view showing the arrangement of transistors of FIG. 10;

FIG. 12 is a cross sectional view taken along the line 12—12 of FIG. 10;

FIG. 13 is a cross sectional view taken along the line 13—13 of FIG. 10;

FIG. 14 is a cross sectional view taken along the line 14—14 of FIG. 10;

FIG. 17 is a cross sectional view taken along the line 17—17 of FIG. 15;

FIG. 18 is a cross sectional view taken along the line 18—18 of FIG. 15;

FIG. 19 is a cross sectional view taken along the line 19—19 of FIG. 15;

FIG. 23 is a cross sectional view taken along the line 23—23 of FIG. 21; and

FIG. 24 is a cross sectional view taken along the line 24—24 of FIG. 21.

DETAILED DESCRIPTION OF THE PREFERRED EMBODIMENTS

There will now be described an embodiment of this invention with reference to the accompanying drawings.

Figure 2:
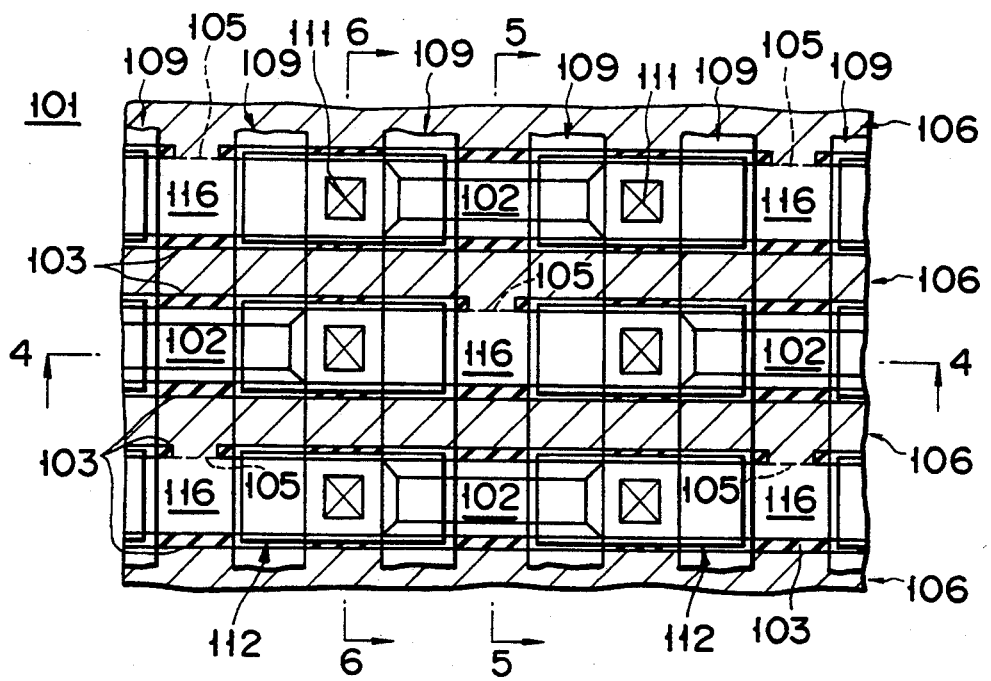
FIG. 2 is pattern plan view of a memory cell area of a DRAM according to a first embodiment of the present invention.
Figure 3:
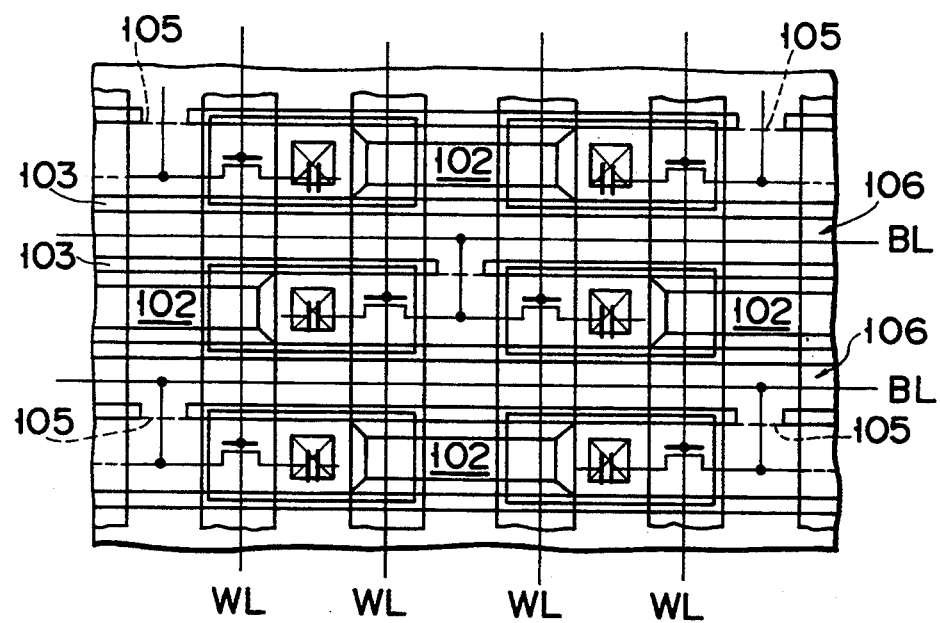
FIG. 3 is a view showing the arrangement of transistors of FIG. 2.
Figure 4:
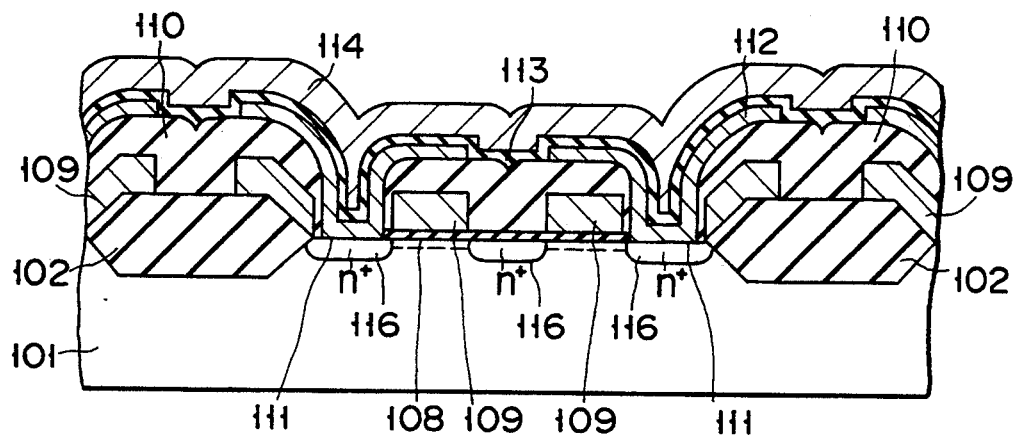
FIG. 4 is a cross sectional view taken along the line 4—4 of FIG. 2.
Figure 5:
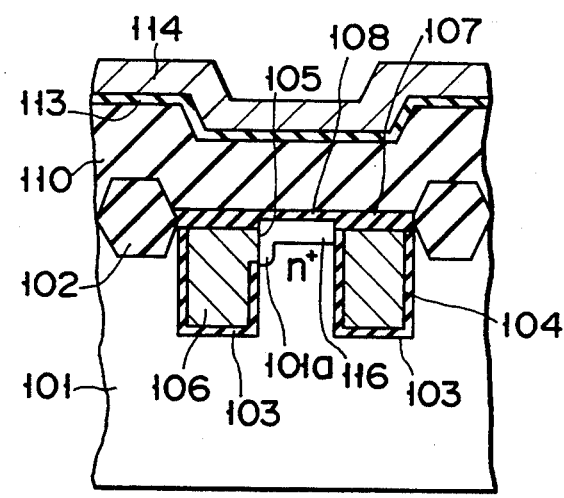
FIG. 5 is a cross sectional view taken along the line 5—5 of FIG. 2.
Figure 6:
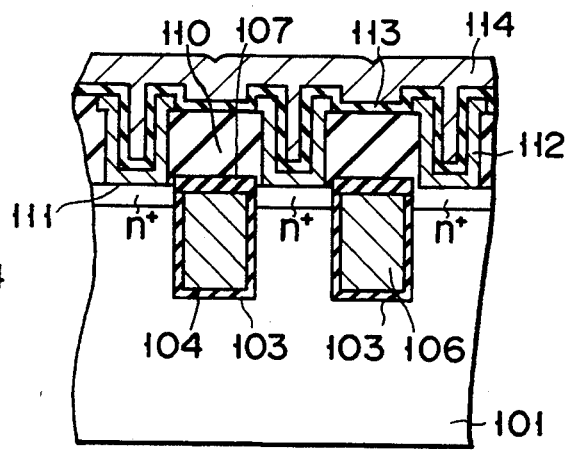
FIG. 6 is a cross sectional view taken along the line 6—6 of FIG. 2.

FIG. 2 is a pattern plan view of a memory cell area of a DRAM according to a first embodiment of this invention, FIG. 3 is a view showing the arrangement of transistors in the above pattern, FIG. 4 is a cross sectional view taken along the line 4—4 of FIG. 2, FIG. 5 is a cross sectional view taken along the line 5—5 of FIG. 2, FIG. 6 is a cross sectional view taken along the line 6—6 of FIG. 2, and FIGS. 7A to 7F are perspective views showing a method of manufacturing the DRAM.

The DRAM according to the first embodiment and the method for manufacturing the same are explained.

Figure 7A:
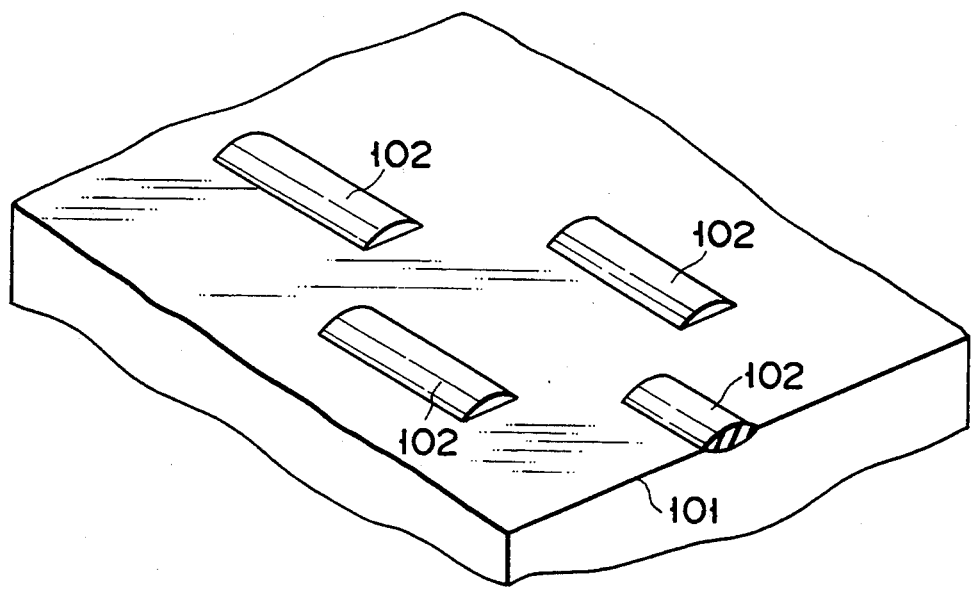
FIGS. 7A to FIG. 7F are perspective views showing a method of manufacturing the DRAM memory cell according to a first embodiment of the present invention.
Figure 7B:
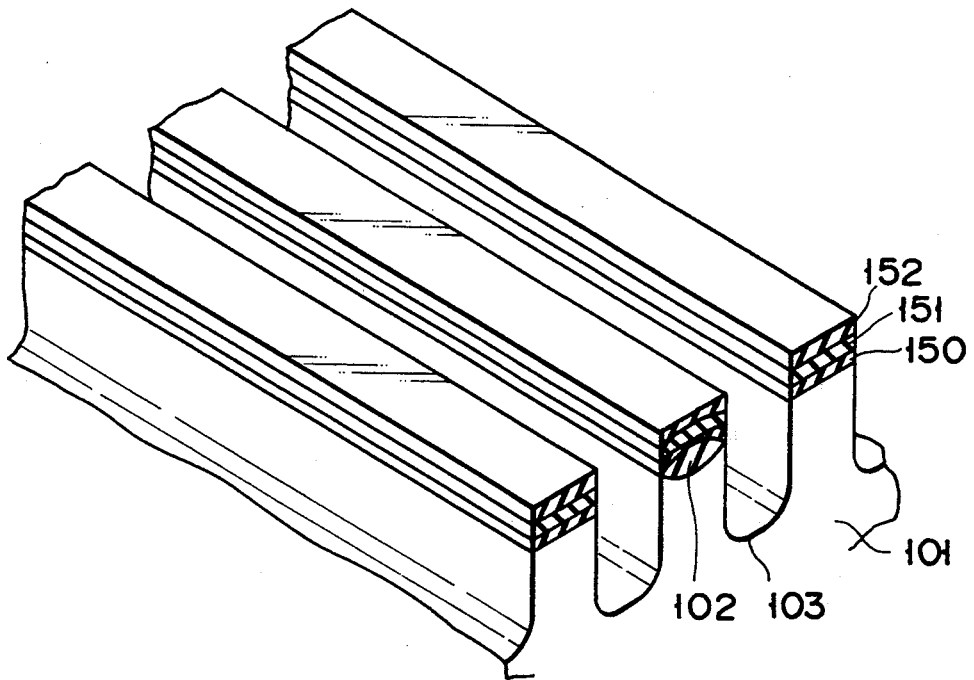
Figure 7C:
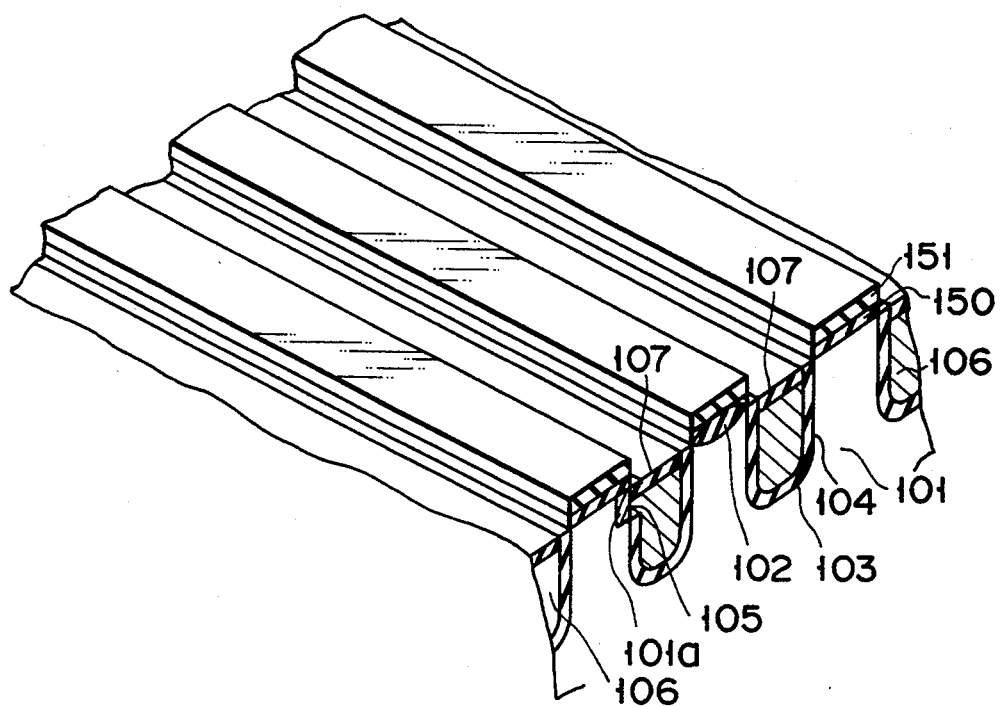

First, field oxide films 102 for element isolation are formed at a regular interval on a P-type semiconductor substrate 101 by local oxidation of silicon, for example (refer to FIG. 7A).

Next, thermal oxide film 150 is formed by thermally oxidizing the surface of the substrate 101. Then, a silicon nitride film 151 and a silicon oxide film 152 are sequentially formed on the substrate 101 by use of a CVD method, for example. After this, the silicon oxide film 152, the nitride film 151 and thermal oxide film 150 are sequentially etched by photo engraving technique. The substrate 101 is sequentially etched with the patterned the silicon oxide film 152, the nitride film 151 and thermal oxide film 150 used as a mask so as to form grooves 103 in the substrate 101 (refer to FIG. 7B).

Next, the silicon oxide film 152 used as the mask is removed. Then, thermal oxide films 104 having a film thickness of approximately 500 Å, for example, are formed on the exposed surfaces of the grooves 103 by thermal oxidation. After this, a photoresist is used as a mask to selectively etch the thermal oxide films 104 on the exposed surfaces of the grooves 103 so as to form openings 105 therein. Then, arsenic ions are implanted in an oblique direction into the semiconductor substrate 101 via the openings 105 to approximately $1 \times 10^{15}$ cm$^{-2}$ (dose) so as to form n-type diffused layers 101a (refer to FIGS. 2 and 5). After this, a conductive film, for example, phosphorus doped polysilicon is deposited on the entire surface of the semiconductor substrate 101 and is etched back by RIE, for example, to fill the grooves 103 and form bit lines 106. At this time, the openings 105 are also filled with the bit lines 106.

Next, the exposed top surface of the bit lines 106 is thermally oxidized with the nitride film 151 used as a mask to form thermal oxide films 107. As this time, the bit lines 106 may be connected to the n-type diffused layer 101a (refer to FIG. 7C).

Figure 7D:
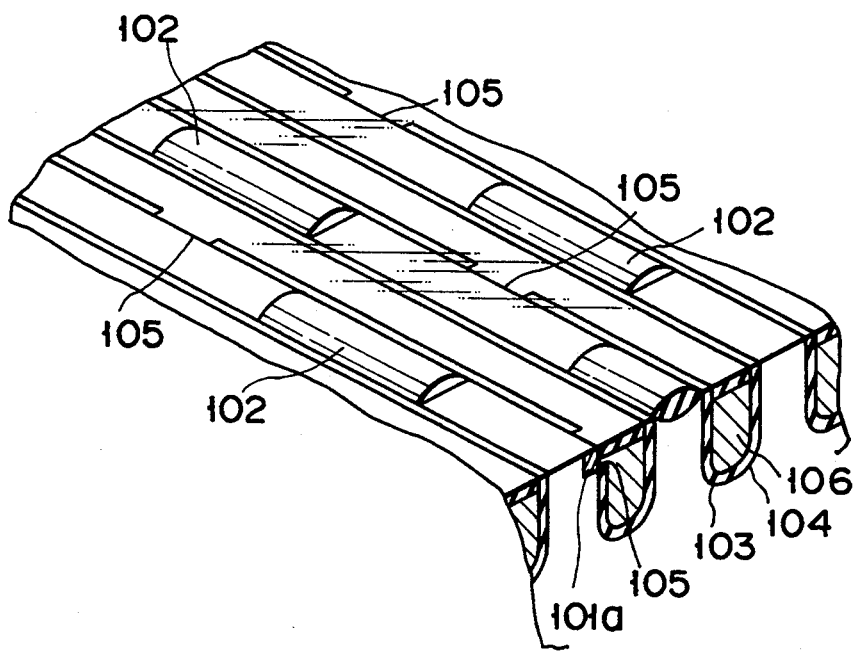

After this, the nitride film 151 and thermal oxide film 150 are sequentially and selectively etched out to expose the surface of the substrate 101 (refer to FIG. 7D).

Next, gate oxide films 108 of approximately 100 Å, for example, are formed on respective element regions each of which is surrounded by adjacent two of the field oxide films 102, 102 and a corresponding one of the grooves 103 by thermal oxidation. Then, a conductive film, for example, phosphorus doped polysilicon is deposited to a thickness of approximately 2000 Å and is patterned to form gate electrodes 109 of the transfer transistors (FIG. 7E) by photo engraving technique.

Figure 7E:
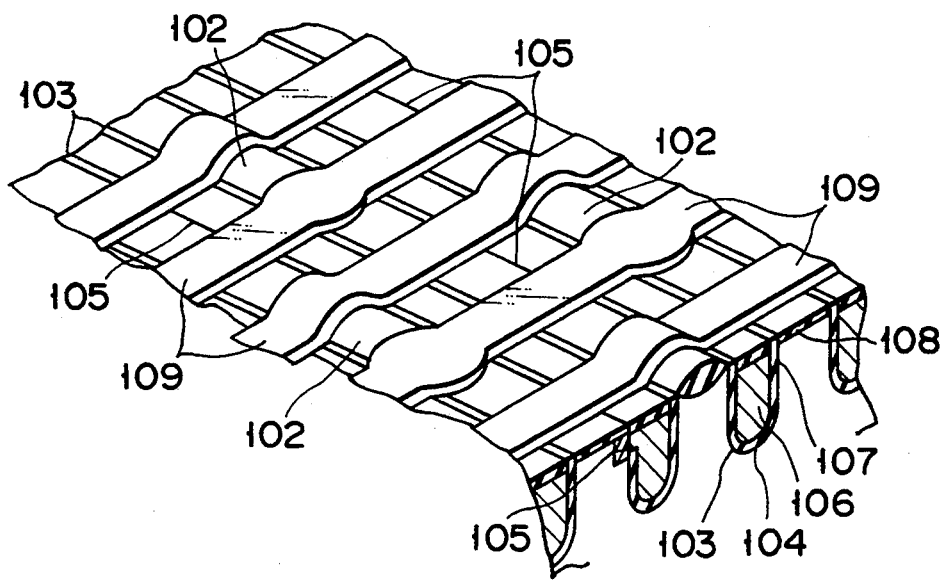
Figure 7F:
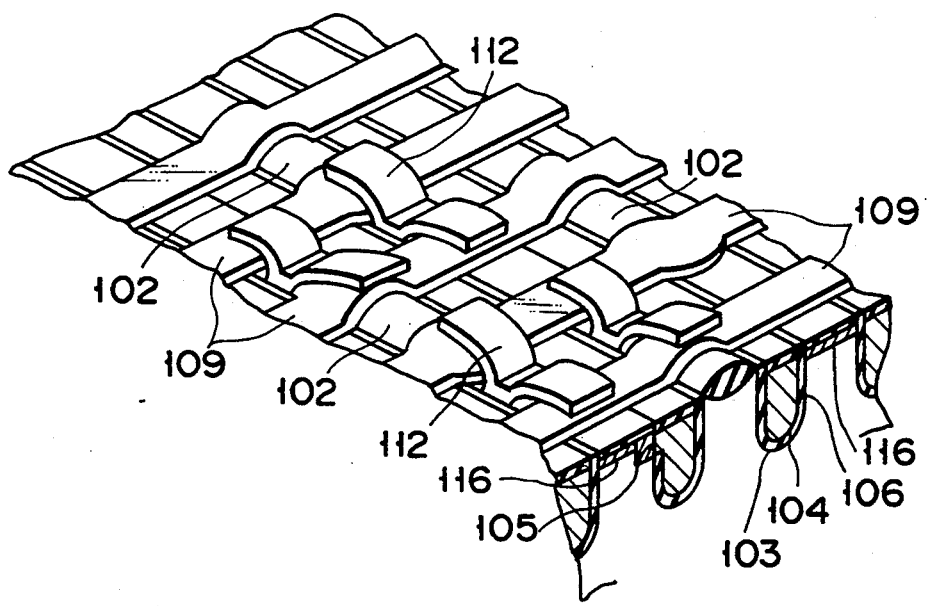

After this, for example, arsenic ions are implanted into portions of the semiconductor substrate 101 on both sides of each gate electrode 109 to approximately $1 \times 10^{16}$ cm$^{-2}$ (dose) so as to form n-type diffused layers 116 serving as the source and drain of each transistor (refer to FIGS. 4 to 7F). Next, an insulation film, for example, oxide film 110 is formed on the resultant structure by use of the CVD method and then contact holes 111 are formed by RIE, for example, on the n-type diffused layers 116 which lie outside the gate electrode 109 by RIE by photo engraving technique (refer to FIGS. 4 to 6). Next, a conductive film, for example, phosphorus doped polysilicon is deposited on the oxide films 110 and in the contact holes 111 and is then patterned to form storage node electrodes 112 (FIG. 7F).

Next, a laminated film 113 of $SiO_2$, $SiN_x$ and $SiO_2$ is formed as a capacitor dielectric film on the storage node electrodes 112 and the like to a thickness equivalent to a thickness of approximately 50 Å of an $SiO_2$ film and then, for example, phosphorus doped polysilicon is deposited as plate electrodes 114 (refer to FIGS. 4 and 6). After this, an insulation film (not shown) is formed on the plate electrodes 114. Then, contact holes are formed in the above insulation film by photo engraving technique and Al wirings which are connected to the gate electrodes 109, for example, are formed to complete the semiconductor device.

Figure 1:
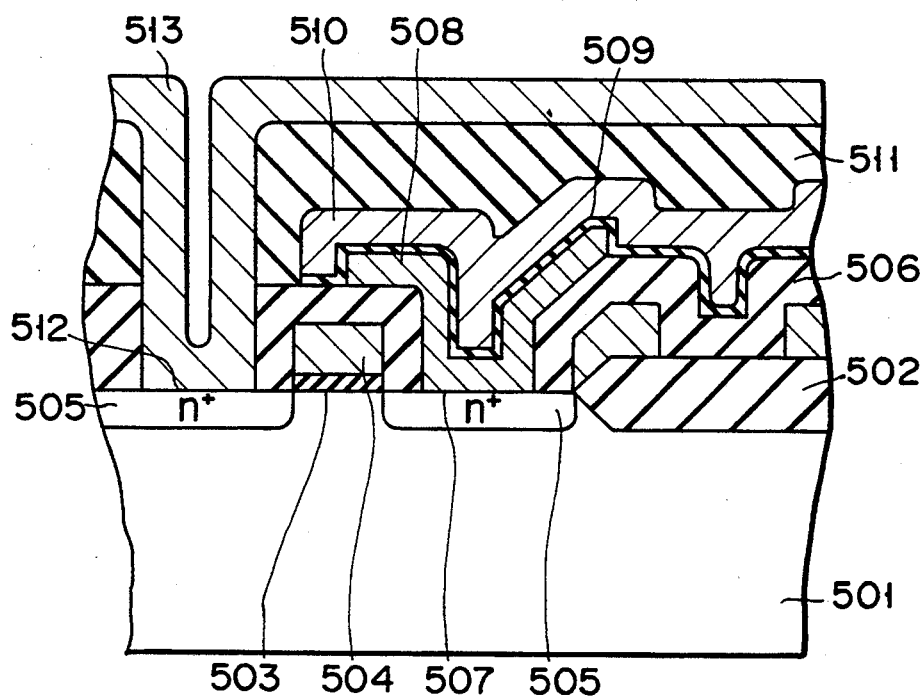
FIG. 1 is a cross sectional view of a conventional stacked capacitor cell.

According to the above embodiment, since the bit lines 106 are formed before the transistor and capacitors are formed, contacts between the bit lines and the n-type diffused layers of the transistors can be easily formed. Further, the contacts can be made simply by selectively removing part of the thermal oxide film 104 formed on the internal surface of the groove 103. Therefore, it is not necessary to form contact holes like the deep contact holes 512 of the conventional memory cell shown in FIG. 1. Since the bit lines are buried in the semiconductor substrate 101, the memory cell area can be made flat on substantially the entire surface. As a result, the possibility of breakage of wires at the stepped portions in the semiconductor device becomes small, and therefore a semiconductor structure suitable for high integration can be obtained.

Formation of the grooves 103 and oxide films on the bit lines 106 can be effected according to the following method.

Figure 7G:
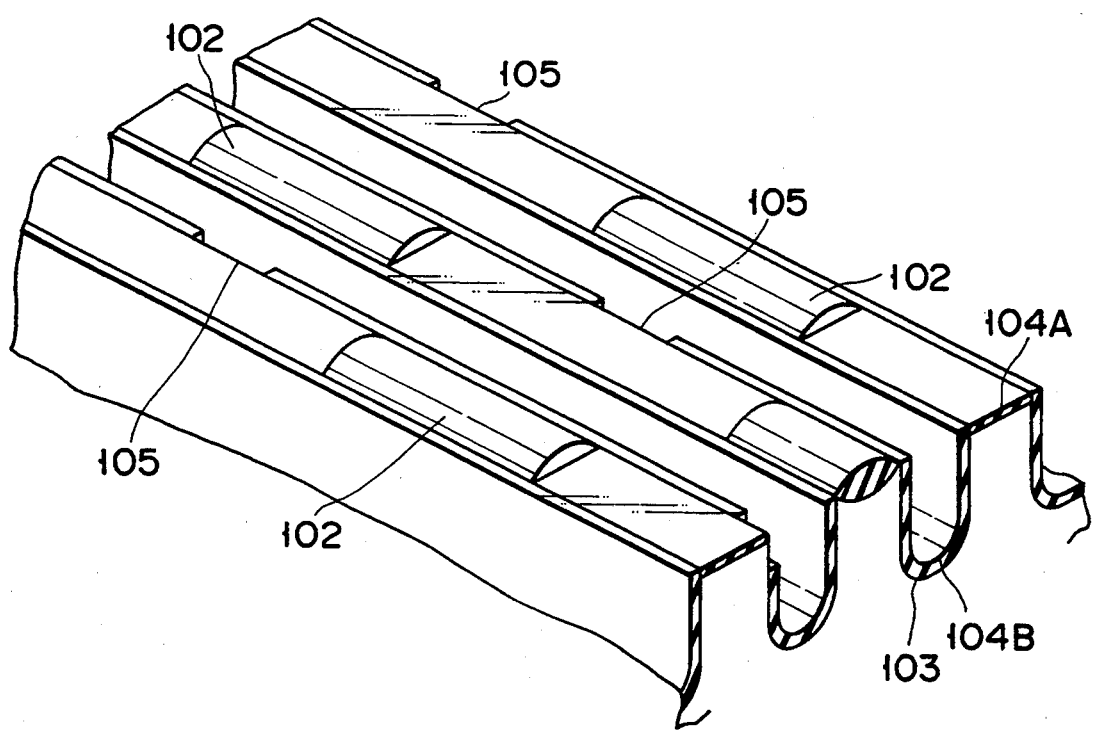

FIGS. 7G to 7I are perspective views of semiconductor structures for illustrating a method for manufacturing the DRAM memory cell according to a modification of the first embodiment.

As shown in FIG. 7G, the field oxide films 102 are formed. Then, a photoresist is formed and a pattern of the grooves 103 is formed in the photoresist by a photo etching process. The patterned photoresist is used as a mask to selectively etch out the semiconductor substrate 101 so as to form the grooves 103. Then, the photoresist is removed. After this, the exposed silicon surfaces such as the internal surfaces of the grooves 103 are thermally oxidized to form thermal oxide films 104A and 104B. Then, a photoresist is again formed and a pattern of the openings 105 is formed in the photoresist by a photo etching process. The patterned photoresist is used as a mask to selectively etch out the oxide films 104B formed on the internal surfaces of the grooves 103 so as to form the openings 105 (FIG. 7G).

Next, a conductive film, for example, phosphorus doped polysilicon is deposited on the entire surface of the resultant structure and the polysilicon is etched back by RIE to leave the polysilicon only in the grooves 103. As a result, the bit lines 106 are formed. After this, the exposed top surfaces of the bit lines 106 are thermally oxidized to form thermal oxide films 107 which are thicker than the thermal oxide films 104A (FIG. 7H).

Next, the thermal oxide films 104A and 107 are etched. Since, at this time, the oxide film 104A is thinner than the thermal oxide film 107, the thermal oxide film 104A is completely etched out to expose part of the surface of the semiconductor substrate 101. On the other hand, the thermal oxide film 107 is not completely etched out and partly left behind on the surface of the bit lines 106.

After this, a method explained with reference to FIGS. 7E to 7F is effected.

FIG. 8 is a cross sectional view of the same portion as that of FIG. 5 and shows a DRAM according to a second embodiment of this invention. In FIG. 8, portions which are the same as those of FIGS. 2 to 6 are denoted by the same reference numerals and only different portions are explained.

In the first embodiment, the bit lines 106 and the n-type diffused layers 116 of one of the transistors are connected together via the openings 105 formed in the grooves 103, but in this embodiment, they are connected together without forming the openings 105 in the grooves 103.

That is, in this embodiment, the bit lines 106 and the n-type diffused layer 116 of one of the transistors are connected together via a phosphorus doped polysilicon layer 115 formed over the oxide film 104, for example. Further, in the case of this embodiment, since there is a possibility that a capacitor may be formed between the phosphorus doped polysilicon layer 115 and the plate electrode 114, it is preferable to form an insulation film 120 having a sufficiently large film thickness on polysilicon layer 115. The capacitance between the polysilicon layer 115 and the plate electrode 114 can be reduced by forming the insulation film 120, thereby making it possible to prevent a capacitor from being formed between them.

With the above construction, the same effect as that of the first embodiment can be obtained.

FIG. 9 is a cross sectional view of the same portion as that of FIG. 5 and shows a modification of the second embodiment.

That is, in this modification, a polysilicon layer 115A which is formed in the opening by the selective epitaxial growth is used instead of the polysilicon layer 115.

With this construction, the same effect as that of the first embodiment can be attained.

FIG. 10 is a pattern plan view of a memory cell area of a DRAM according to a third embodiment of this invention, FIG. 11 is a view showing the arrangement of transistors in this pattern, FIG. 12 is a cross sectional view taken along the line 12—12 of FIG. 10, FIG. 13 is a cross sectional view taken along the line 13—13 of FIG. 10, and FIG. 14 is a cross sectional view taken along the line 14—14 of FIG. 10.

In the first and second embodiments, bit lines are formed in the semiconductor substrate, but in this embodiment, capacitors are formed in the semiconductor substrate in addition to the bit lines.

That is, field oxide films 202 for element isolation are formed at a regular interval on the surface of a P-type semiconductor substrate 201 (refer to FIGS. 10, 12 and 14).

Next, grooves 203 are formed in the semiconductor substrate 201 and then thermal oxide films 204 having a film thickness of approximately 500 Å, for example, are formed on the internal surfaces of the grooves 203 by thermal oxidation (refer to FIGS. 10, 13 and 14).

After this, openings 205 are formed by partly etching the respective thermal oxide films 204 on the internal surfaces of the grooves 203 with a photoresist used as a mask. Then, ions are implanted via the openings 205 in an oblique direction to ion-implant arsenic to approximately $1 \times 10^{15}$ cm$^{-2}$ (dose), for example, into portions of the semiconductor substrate 201 exposed to the openings 205 so as to form n-type diffused layers 201a (refer to FIG. 14).

Next, a conductive film, for example, phosphorus doped polysilicon is deposited on the entire surface of the semiconductor substrate 201 and is etched back by RIE, for example, to fill the grooves 203, thus forming bit lines 206 (refer to FIGS. 10, 13 and 14). At this time, the openings 205 are filled with the bit lines 206.

Next, oxide films 207 are formed on the exposed top surfaces of the bit lines 206 by thermal oxidation. The bit lines 206 are connected to the respective n-type diffused layers 201a (refer to FIGS. 13 and 14).

After this, trenchs 208 of approximately 10 μm, for example, are formed in element regions and field oxide 202 each of which is surrounded by the adjacent field oxide films 202 and a corresponding one of the grooves 203 by RIE with a photoresist used as a mask and then arsenic ions, for example, are implanted therein to approximately $1 \times 10^{15}$ cm$^{-2}$ (dose) to form n-type diffused layers (storage rode electrodes) 208a on the internal surfaces of the trenches 208 (refer to FIGS. 10, 12 and 13).

Next, a laminated film 209 formed of SiO$_2$, SiNx dielectric film to a film thickness equivalent to a film thickness of approximately 90 Å of an SiO$_2$ film, then phosphorus doped polysilicon is deposited, for example, and it is patterned to form plate electrodes 210 with a photoresist used as a mask. After this, a thermal oxidation process is effected to form an insulation film 211 on the plate electrode 210 (refer to FIGS. 10, 12 to 14).

Further, gate oxide films 212 of approximately 100 Å, for example, are formed on element regions each of which is surrounded by the grooves 203 and the plate electrode 210, and then a conductive film, for example, phosphorus doped polysilicon is deposited to approximately 2000 Å and is patterned to form gate electrodes 213 of transfer transistors. After this, n-type diffused layers 214 serving as the source and drain regions of the transistors are formed by implanting arsenic ion, for example, into the semiconductor substrate 201 to approximately $1 \times 10^{15}$ cm$^{-2}$ (dose) (refer to FIGS. 10, 12 to 14).

After this, an interlevel insulator (not shown) is formed on the entire surface of the resultant structure. Then, contact holes are formed in the above interlevel insulator with a photoresist used as mask, and then Al wirings which are connected to word lines (gate electrodes 213), for example, are formed to complete the semiconductor device.

Since the bit lines are formed in the semiconductor substrate in the third embodiment, a contact between the bit line and one of the n-type diffused layers 214 of the transistor may be easily formed. Further, since the cell area may be made flat, the high integration density may be easily attained.

Figure 15:
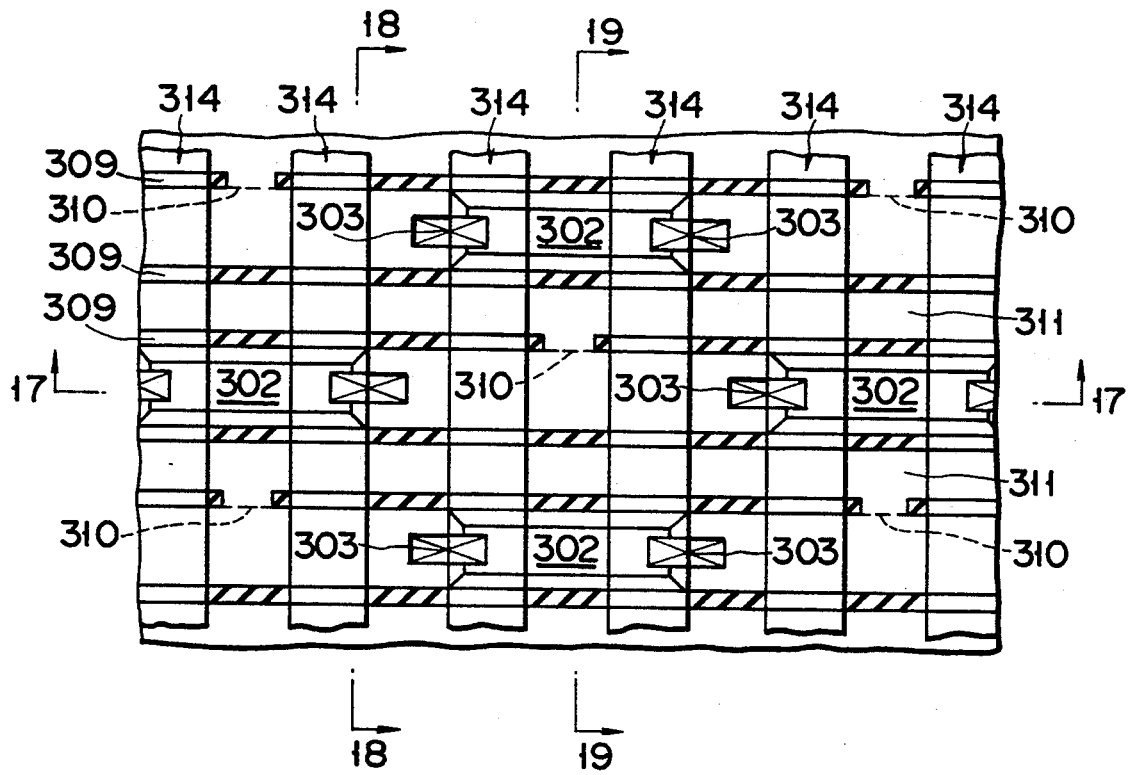
FIG. 15 is a pattern plan view of a memory cell area of a DRAM according to a fourth embodiment of the present invention.
Figure 16:
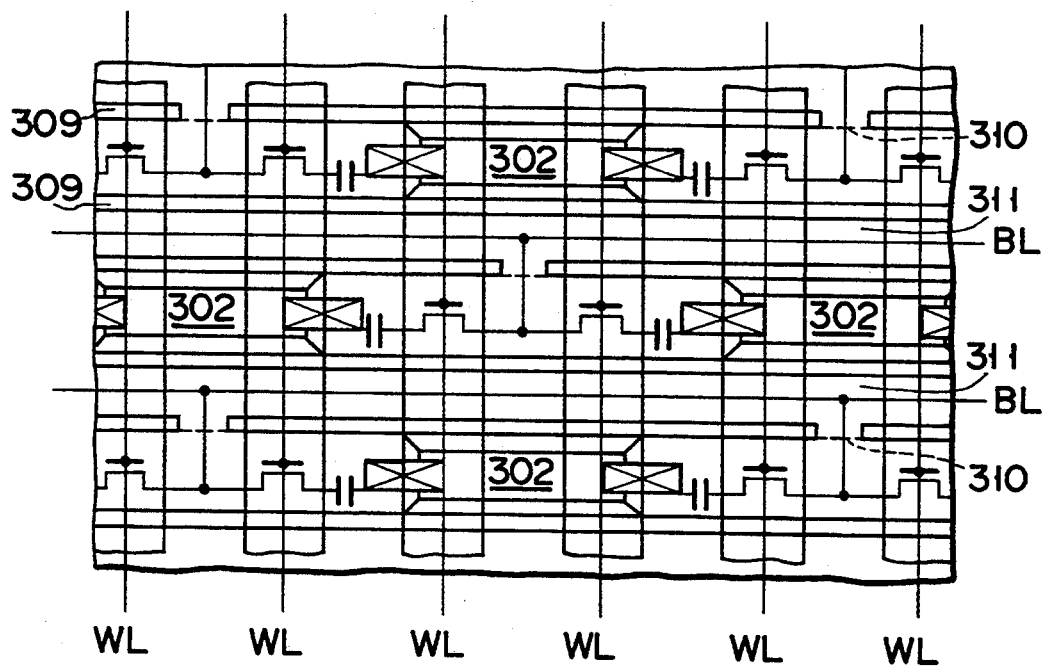
FIG. 16 is a view showing the arrangement of transistors of FIG. 15.

FIG. 15 is a pattern plan view of a memory cell area of a DRAM according to a fourth embodiment of this invention, FIG. 16 is a view showing the arrangement of transistors in the pattern, FIG. 17 is a cross sectional view taken along the line 17—17 of FIG. 15, FIG. 18 is a cross sectional view taken along the line 18—18 of FIG. 15, and FIG. 19 is a cross sectional view taken along the line 19—19 of FIG. 15.

In the third embodiment, the bit lines 206 and the n-type diffused layers (storage node electrodes) 208a, laminated films 208 and plate electrodes 210 which constitute capacitors are formed in the semiconductor substrate, but in this embodiment, bit lines are buried in the semiconductor substrate and the semiconductor substrate is used as a plate electrode of the capacitor.

That is, field oxide films 302 are formed on the surface of a P-type semiconductor substrate 301 with a preset distance set therebetween (refer to FIGS. 15, 17 to 19).

Next, trenchs 303 of approximately 10 μm, for example, are formed in desired portions of the element regions and field oxide films 302 by RIE and oxide films 304 of approximately 100 Å used as capacitor dielectric films are formed on the internal side surfaces of the trenchs 303 by thermal oxidation (refer to FIGS. 15, 17 and 18).

Then, a portion of the oxide film 304 is selectively etched with a photoresist used as a mask to form openings 305. After this, the photoresist is removed and ions are implanted via the openings 305 in an oblique direction to ion-implant arsenic to approximately $1 \times 10^{15}$ cm$^{-2}$ (dose), for example, into those portions of the semiconductor substrate 301 which are exposed to the openings 305 so as to form n-type diffused layers 301a. Then, a conductive film, for example, phosphorus doped polysilicon is deposited in the trenches 303 and etched back by RIE, for example, to form storage node electrodes 306 (FIGS. 17 and 18).

Next, thermal oxide films 307 are formed on the exposed top exposed surfaces of the storage node electrodes 306 by thermal oxidation. At this time, the storage node electrodes 306 are connected to the respective n-type diffused layers 301a via the openings 305 (refer to FIG. 17).

After this, grooves 308 are formed with a preset distance set therebetween in the semiconductor substrate 301 and then thermal oxide films 309 of approximately 500 Å are formed on the internal surfaces of the grooves 308 by thermal oxidation (refer to FIGS. 15, 18 and 19).

Next, portions of the thermal oxide films 309 are etched with a photoresist used as a mask to form openings 310. Then, ions are implanted via the openings 310 in an oblique direction to ion-implant arsenic to approximately $1 \times 10^{15}$ cm$^{-2}$ (dose), for example, into those portions of the semiconductor substrate 301 which are exposed to the openings 310 so as to form n-type diffused layers 301b (refer to FIGS. 15 and 19).

After this, a conductive film, for example, phosphorus doped polysilicon is deposited on the entire surface of the semiconductor substrate 301 and then etched back to fill the grooves 308 by RIE, for example, so as to form bit lines 311 (refer to FIGS. 15, 18 and 19).

Further, thermal oxide films 312 are formed on the top exposed surface of the bit lines 311 by thermal oxidation. At this time, the bit lines 311 are connected to the n-type diffused layers 301b via the openings 310 (refer to FIG. 19).

Next, gate oxide films 313 of 100 Å, for example, are formed on element regions surrounded by the field oxide film 302 and grooves 308 by thermal oxidation and a conductive film, for example, phosphorus doped polysilicon is deposited to approximately 2000 Å on the resultant structure and is patterned to form gate electrodes 314 of the transfer transistors. After this, for example, arsenic ions are implanted to approximately $1 \times 10^{15}$ cm$^{-2}$ (dose) for example, into the substrate 301 to form n-type diffused layers 315 serving as the source and drain regions of the transistors (FIGS. 17 and 19).

After this, an interlevel insulator (not shown) is formed and contact holes are formed in the interlevel insulator with a photoresist used as a mask, and then Al wirings which are electrically connected to the gate electrodes 314, for example, and the like are formed to complete the semiconductor device.

Figure 20:
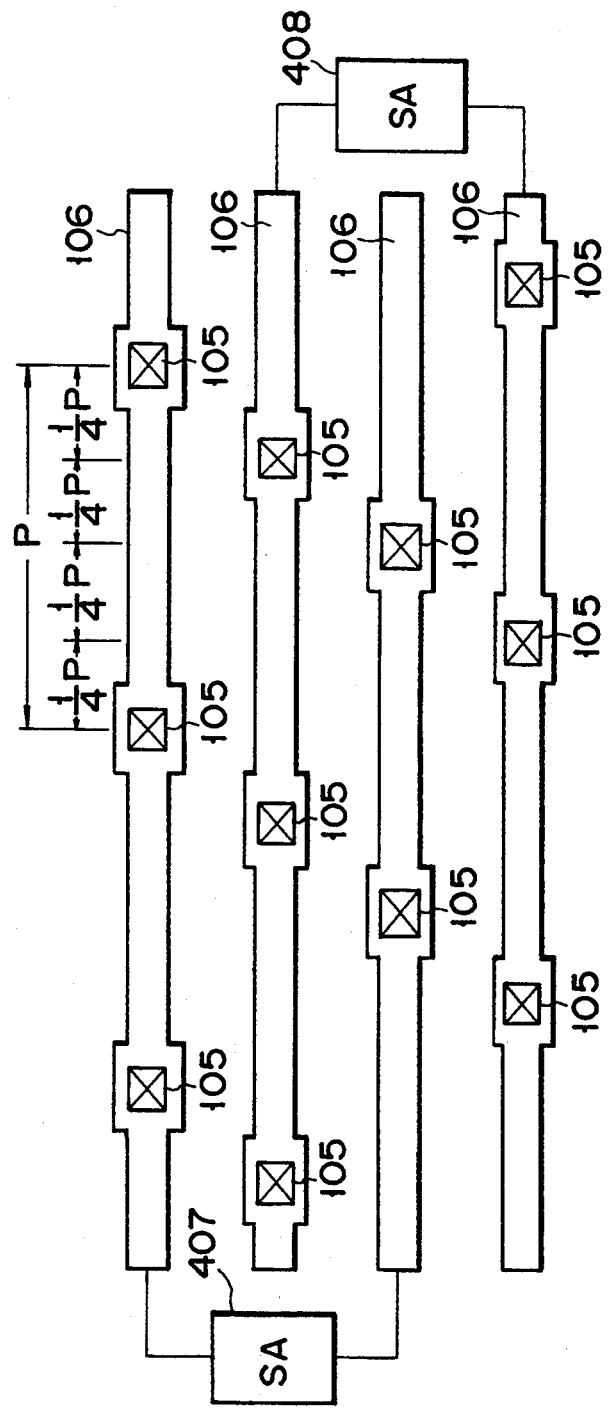
FIG. 20 is a view showing a pattern in which the positions of contacts between the bit lines and the drain regions of the transfer transistors are deviated by ½n (n is an integer)
Figure 21:
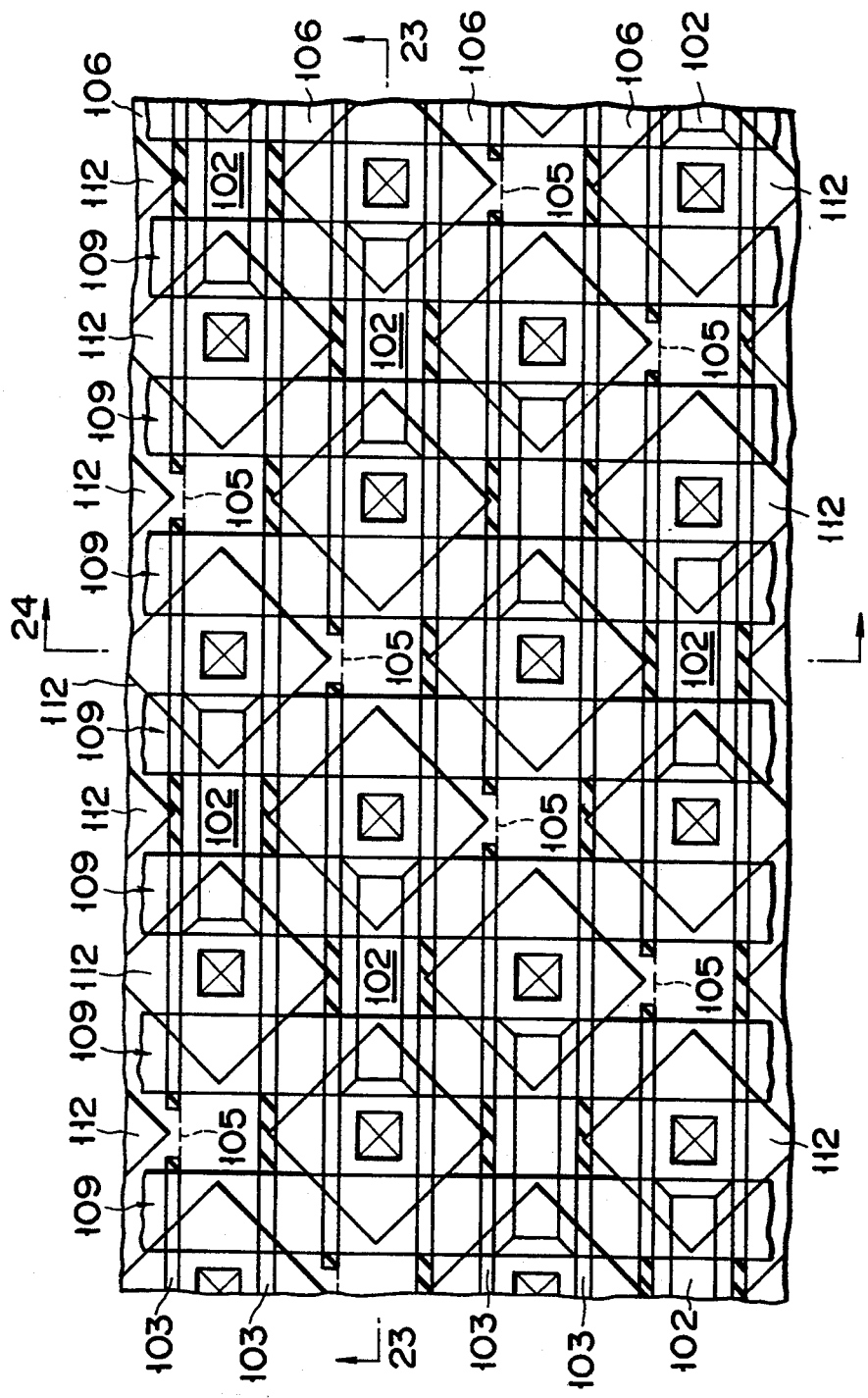
FIG. 21 is a pattern plan view of a memory cell area of a DRAM according to a fifth embodiment of the present invention.
Figure 22:
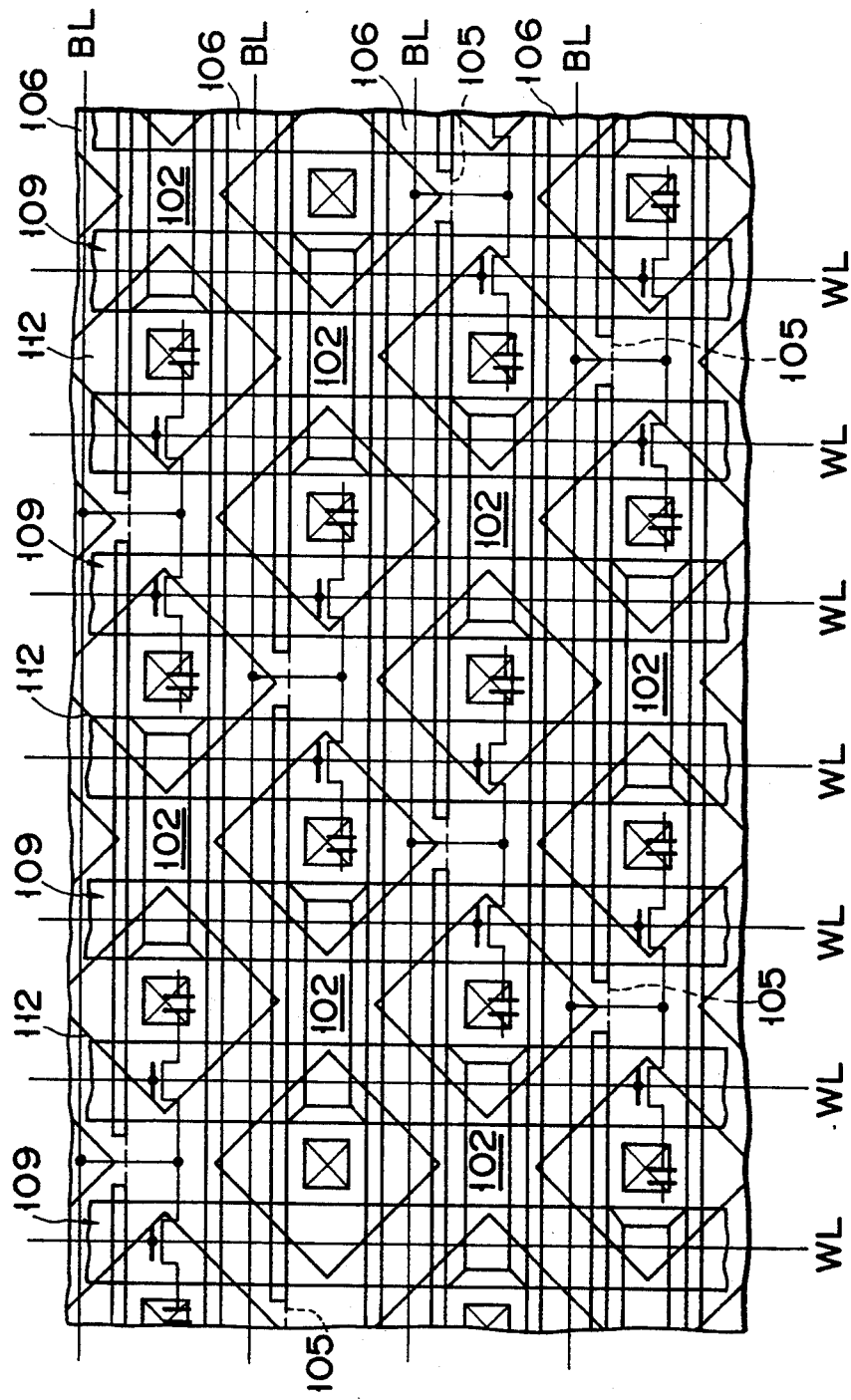
FIG. 22 is a view showing the arrangement of transistors of FIG. 21.

FIG. 20 is a view showing a pattern in which the positions of contacts between the bit lines and the drain regions of the transfer transistors are deviated by ½n (n is an integer) pitch, FIG. 21 is a pattern plan view of a memory cell area of a DRAM according to a fifth embodiment of this invention, FIG. 22 is a view showing the arrangement of transistors in the pattern, FIG. 23 is a cross sectional view taken along the line 23—23 of FIG. 21, and FIG. 24 is a cross sectional view taken along the line 24—24 of FIG. 21.

This embodiment is different from the first embodiment in the arrangement of the memory cells of the DRAM and the construction of the cell is the same as that shown in FIGS. 2 to 6. In FIGS. 20 to 24, portions which are the same as those of FIGS. 2 to 6 are denoted by the same reference numerals.

That is, in this embodiment, a pattern in which the positions of contacts between the bit lines and the drain regions of the transfer transistors are deviated by ½n (n is an integer) pitch is used. The pattern is schematically shown in FIG. 20.

In the pattern shown in FIG. 20, the positions of contacts are deviated by ¼ pitch and the pattern is called a folded bit line pattern because of the arrangement of the bit lines. That is, bit line sense amplifiers 407 and 408 are connected to the opposite ends of a plurality of bit lines 106 which are arranged in parallel. More specifically, two bit lines lying on both sides of an odd-numbered or even-numbered bit line and making a complementary pair are connected at one or the other end thereof to one of the sense amplifiers 407 and 408.

Each of the bit lines 106 has contacts 105 for the drains (or sources) of the transfer transistors arranged at a constant pitch in the lengthwise direction thereof. In this case, the contact position of one of the bit lines are deviated from the contact position of the adjacent bit line by ¼ pitch in the lengthwise direction of the bit line.

FIGS. 20 to 24 show the arrangement of the memory cells explained in the first embodiment in the above pattern.

That is, as shown in FIGS. 20 to 24, the bit lines and word lines are arranged in directions to intersect each other and an element region for two transfer transistors are formed to cross two bit lines and two adjacent word lines. Further, each of the bit lines are connected to capacitors corresponding to two transfer transistors at portions which intersect the element regions at a constant pitch P in the lengthwise direction thereof so as to form two cells of one-transistor/one-capacitor structure in each element region.

In a plurality of bit lines arranged in parallel, the position of contact of each of the bit lines are deviated from the position of contact of the adjacent bit line by substantially ¼ pitch in the lengthwise direction of the bit line.

As described above, according to this invention, there can be provided a semiconductor memory device and a method for manufacturing the same in which since the cell structure can be made flat by burying the bit lines in the internal portion of the semiconductor substrate, bit line contacts may be easily obtained in comparison with the prior art case.

Further, this invention is not limited to the above embodiments and can be variously modified without departing from the technical scope thereof.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device, comprising:
   a semiconductor body of a first conductivity type having first and second spaced-apart parallel grooves which extend in a first direction formed therein, said first and second grooves defining a middle region therebetween;
   first and second field insulating films formed on the surface of said middle region, each of said first and second field insulating films extending so as to contact both said first and second grooves;
   first and second spaced-apart parallel word lines extending in a second direction perpendicular to the first direction;
   a first semiconductor region of a second conductivity type formed in a first portion of said middle region, said first portion of said middle region being disposed between one of said first and second words lines and one of said first and second field insulating films, and said first semiconductor region serving as a source of a first memory cell and being connected to a first memory capacitor;
   a second semiconductor region of the second conductivity type formed in a second portion of said middle region, said second portion of said middle region being disposed between the other of said first and second word lines and the other of said first and second field insulating films, and said second semiconductor region serving as a source of a second memory cell and being connected to a second memory capacitor;
   a third semiconductor region of the second conductivity type formed in a third portion of said middle region, said third portion of said middle region being disposed between said first and second word lines and serving as a drain which is common to said first and second memory cells;
   a first insulating film formed on an exposed surface of said first groove and having an opening therein which extends to said third semiconductor region;
   a second insulating film formed on an exposed surface of said second groove;
   a first bit line formed in said first groove, said first bit line being connected to said third semiconductor region via an electrical path which extends through said opening in a direction substantially perpendicular to a direction of current paths between said sources of the first and second memory cells and said common drain; and
   a second bit line formed in said second groove.

2. A semiconductor memory device according to claim 1, wherein said first and second grooves provide element isolation in the second direction.

3. A semiconductor memory device according to claim 2, wherein said first memory capacitor comprises a storage node electrode connected to said first semiconductor region and said second memory capacitor comprises a storage node electrode connected to said second semiconductor region.

4. A semiconductor memory device according to claim 3, wherein each of said first and second memory capacitors is a stacked-type memory capacitor, and wherein said first and second memory capacitors further comprise:
   a plate electrode formed on an entire surface of said semiconductor body.

5. A semiconductor memory device according to claim 3, wherein said storage node electrodes of said first and second memory capacitors overlap said first and second grooves.

6. A semiconductor memory device according to claim 5, wherein each of said first and second memory capacitors is a stacked-type memory capacitor, and wherein said first and second memory capacitors further comprise:
   a plate electrode formed on an entire surface of said semiconductor body.

7. A semiconductor memory device according to claim 4, wherein said first and second bit lines are composed of phosphorus-doped polysilicon.

8. A semiconductor memory device, comprising:
   a semiconductor body having a major surface;
   first and second grooves in said major surface of said semiconductor body;
   first and second field insulating film portions on said major surface of said semiconductor body between said first and second grooves, said first and second field insulating film portions extending to said first and second grooves to define an active region surrounded by said first and second grooves and said first and second field insulating film portions;
   source and drain regions in said active region, wherein a junction between said source region and said semiconductor body extends to both said first and second grooves and a junction between said drain region and said semiconductor body extends to both said first and second grooves;
   a gate electrode insulatively arranged on a channel region between said source and drain regions;
   a first insulating film on portions of said semiconductor body exposed by said first and second grooves;
   a first conductive film on said first insulating film and filling in said grooves to define first and second bit lines; and connecting means for electrically connecting one of said first and second bit lines to a first one of said source and drain regions.

9. A semiconductor memory device according to claim 8, wherein said connecting means comprises:
   an opening in said first insulating film adjacent to said first one of said source and drain regions; and
   a diffusion region contacting said one of said first and second bit lines and said first one of said source and drain regions and extending through said opening.

10. A semiconductor memory device according to claim 8, wherein said connecting means comprises:
    a second conductive film contacting an upper surface of said first one of said source and drain regions and an upper surface of said one of said first and second bit lines.

11. A semiconductor memory device according to claim 10, wherein said second conductive film is a phosphorous-doped polysilicon layer.

12. A semiconductor memory device according to claim 8, further comprising:
    a capacitor having a storage node contact electrode connected to a second one of said source and drain regions.

13. A semiconductor memory device according to claim 12, further comprising:
    a trench in said active region,
    wherein said storage node contact electrode of said capacitor comprises a second conductive film on a portion of said semiconductor body exposed by said trench.

14. A semiconductor memory device according to claim 13, wherein said capacitor further comprises:
    a dielectric layer on said storage node contact electrode; and
    a third conductive film on said dielectric layer and filling in said trench to define a plate electrode.

15. A semiconductor memory device according to claim 12, further comprising a trench in said active region and wherein said capacitor comprises:
    a second insulating film on portions of said semiconductor body exposed by said trench;
    a third conductive film on said second insulating film and filling in said trench to define said storage node contact electrode; and
    wherein said semiconductor body comprises a plate electrode.

* * * * *